United States Patent
Miwa et al.

(10) Patent No.: US 9,947,851 B2
(45) Date of Patent: Apr. 17, 2018

(54) LED PACKAGE

(71) Applicant: TOYODA GOSEI CO., LTD., Kiyosu-shi (JP)

(72) Inventors: Tomohiro Miwa, Kiyosu (JP); Shota Shimonishi, Kiyosu (JP); Daisuke Kato, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/377,835

(22) Filed: Dec. 13, 2016

(65) Prior Publication Data
US 2017/0213947 A1 Jul. 27, 2017

(30) Foreign Application Priority Data
Jan. 22, 2016 (JP) .................. 2016-011061

(51) Int. Cl.
 H01L 33/00 (2010.01)
 H01L 33/64 (2010.01)
 H01L 33/48 (2010.01)
 H01L 33/56 (2010.01)
(52) U.S. Cl.
 CPC .......... *H01L 33/642* (2013.01); *H01L 33/486* (2013.01); *H01L 33/56* (2013.01)
(58) Field of Classification Search
 CPC .................................... H01L 33/642
 See application file for complete search history.

(56) References Cited

U.S. PATENT DOCUMENTS

| 8,143,642 | B2 * | 3/2012 | Pei | ............... | H01L 25/0753 257/99 |
| 2015/0214132 | A1 * | 7/2015 | Lee | ............... | H01L 23/3677 165/185 |
| 2016/0284666 | A1 * | 9/2016 | Lee | ............... | H01L 33/60 |

FOREIGN PATENT DOCUMENTS

| JP | 2009-123853 A | 6/2009 |
| JP | 2013-012531 A | 1/2013 |

* cited by examiner

*Primary Examiner* — Jamie C Niesz
(74) *Attorney, Agent, or Firm* — McGinn IP Law Group, PLLC

(57) ABSTRACT

The present invention provides a LED package in which deterioration in heat radiation performance is suppressed. The LED package comprises a substrate, a light-emitting device mounted on the substrate, sealing resin sealing the light-emitting device and mixed with phosphor, a heat sink provided on a rear surface of the substrate, and a rear electrode provided on the rear surface of the substrate and electrically connected to the light-emitting device. The heat sink is provided at a distance from the rear electrode in a region except for the rear electrode. The heat sink is divided into eighteen small heat sinks by grooves formed in a rectangular lattice pattern. When the LED package is mounted on a mounting substrate, the gas generated from solder is efficiently discharged through the grooves to the outside, thereby suppressing the generation of air bubbles between the heat sink and the solder.

20 Claims, 5 Drawing Sheets

Solder

Solder

Solder

LED PACKAGE

BACKGROUND OF THE INVENTION

Field of the Invention

The present invention relates to a LED package in which a plurality of light-emitting devices are mounted on a substrate and those light-emitting devices are sealed with a sealing resin mixed with phosphor, and more particularly, to a LED package having a characteristic in a heat sink pattern on a rear surface of the substrate.

Background Art

A LED package is widely known as a white light source for illumination or backlight, in which a plurality of Group III nitride semiconductor blue light-emitting devices are mounted on a substrate and those light-emitting devices are sealed with sealing resin mixed with yellow phosphor. This LED package achieves white light emission by converting a part of blue light emitted from the light-emitting device into yellow light with yellow phosphor, and mixing the yellow light and the blue light emitted from the light-emitting device.

Since such a LED package is driven by a large current, heat generation from the light-emitting device is large, and it is necessary to efficiently radiate heat to the outside. For example, a heat sink is provided on the rear surface of the substrate in the LED package so that heat is efficiently conducted via solder from the heat sink to the mounting substrate when the LED package is mounted via solder to the mounting substrate.

Japanese Patent Application Laid-Open (kokai) No. 2009-123853 discloses a LED package in which a light-emitting device is sealed with a phosphor-dispersed glass by hot press processing, and describes that there is provided a heat sink divided into a plurality of heat sinks by striped grooves. Such grooves can discharge the gas produced by vaporization of residue such as resist during hot press to the outside, thereby preventing the heat sink from protruding.

Japanese Patent Application Laid-Open (kokai) No. 2013-12531 describes an electronic device provided with a heat radiation member just below the electronic parts in the LED package.

When the rear surface of the LED package and the mounting substrate are joined via solder, gas is emitted from solder, air bubbles are generated between the solder and the heat sink so that a bonding area between the solder and the heat sink is reduced. There was a problem of deterioration in heat radiation performance.

Moreover, the LED package of Japanese Patent Application Laid-Open (kokai) No. 2009-123853 was inappropriate to efficiently discharge the gas generated from solder to the outside because the grooves dividing the heat sink are formed in a stripe pattern.

SUMMARY OF THE INVENTION

Thus, an object of the present invention is to suppress air bubbles between the solder and the heat sink when the LED package is mounted, thereby preventing deterioration in heat radiation performance.

In an aspect of the present invention, there is provided a LED package comprising a substrate, a light-emitting device mounted on the substrate, sealing resin sealing the light-emitting device and being mixed with phosphor, a heat sink provided on a rear surface of the substrate, and a rear electrode provided on the rear surface of the substrate and electrically connected to the light-emitting device, wherein the heat sink is divided into a plurality of small rectangular heat sinks by grooves formed in a lattice pattern.

Corners of each small heat sink are preferably rounded. A stress applied to bonding portions when the mounting substrate and the small heat sinks are bonded via solder, more particularly, to connecting portions between the corners of the small heat sinks and the solder, is released. thereby improving the temperature cycle resistance. Only corners adjacent to the sides of the substrate are preferably rounded because it is more effective to release the stress. When the corner is rounded, its curvature radius is preferably 0.01 to 0.5 times the length of the short side of the rectangle of the small heat sink because more stress can be improved. The curvature radius is more preferably 0.02 to 0.4 times, and further preferably, 0.15 to 0.2 times. For the same reason, the curvature radius of the corner is preferably 10 µm to 300 µm, more preferably, 50 µm to 250 µm, and further preferably, 100 µm to 150 µm.

Any groove pattern may be used as long as the grooves are formed in a lattice pattern. The groove width is preferably 10 µm to 300 µm, thereby efficiently discharging the gas generated from the solder to the outside. The groove width is more preferably, 50 µm to 250 µm, and further preferably, 100 µm to 200 µm.

An area of each small heat sink is preferably 0.05 $mm^2$ to 15 $mm^2$. When the area is within this range, the heat sink is excellent in balance among the effect of discharging the gas generated from the solder to the outside, the heat radiation performance, and the easiness of manufacturing. The area is more preferably, 0.06 $mm^2$ to 10 $mm^2$, and further preferably, 0.08 $mm^2$ to 5 $mm^2$.

A length of the long side of each small heat sink is preferably 7 mm or less. A passage where the gas generated from the solder is discharged through the grooves to the outside is shortened so that the gas is efficiently discharged to the outside. The length is more preferably, 5 mm or less, and further preferably, 3.5 mm or less.

An area of the heat sink (a total area of the small heat sinks) is preferably 10 $mm^2$ or more to ensure sufficient heat radiation performance. When the area of the heat sink is large, the gas generated from the solder easily becomes air bubbles because it is caught between the solder and the heat sink. However, air bubbles can be sufficiently suppressed by providing grooves as in the present invention even when the heat sink is large. The area is more preferably, 15 $mm^2$ or more, and further preferably, 50 $mm^2$ or more.

According to the present invention, the gas generated from the solder is efficiently discharged through the grooves formed in a lattice pattern on the heat sink. Therefore, a reduction in the contact area between the solder and the heat sink can be suppressed, and deterioration in heat radiation performance can be prevented.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
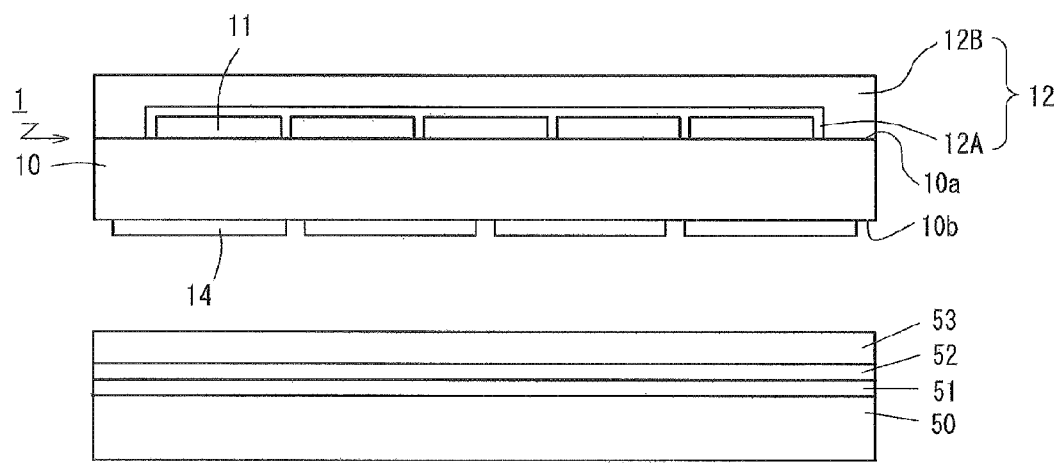
FIG. 1 is a cross-sectional view showing the structure of a LED package according to Embodiment 1.
Figure 2:
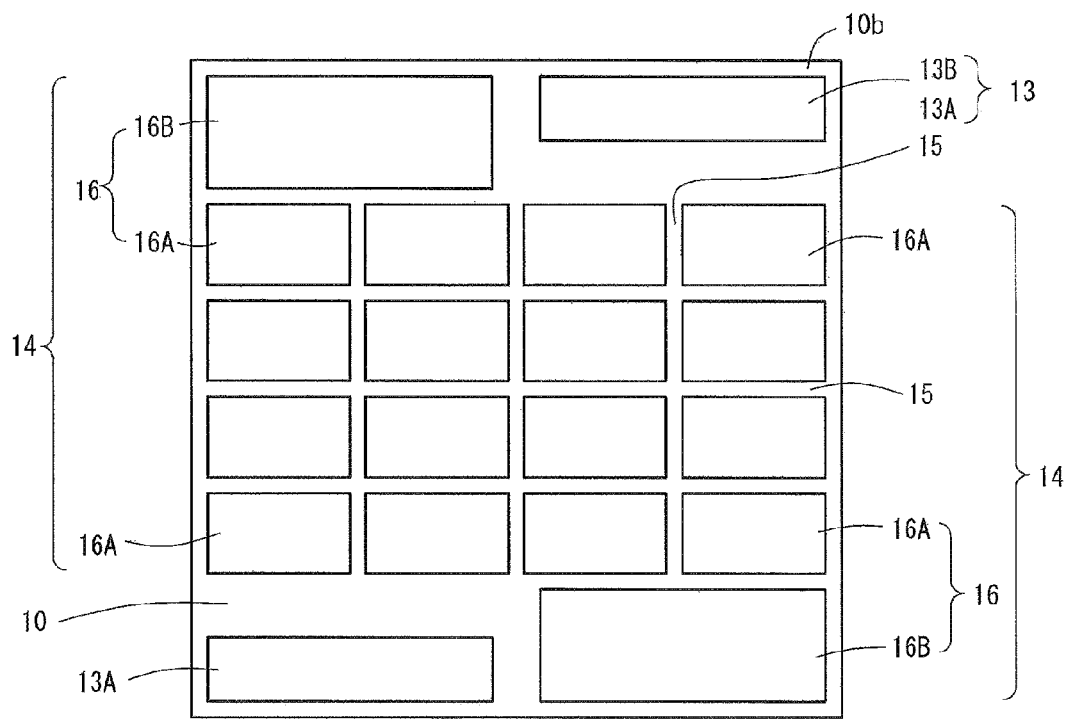
FIG. 2 is a plan view showing the structure viewed from the rear surface of the LED package according to Embodiment 1.
Figure 3:
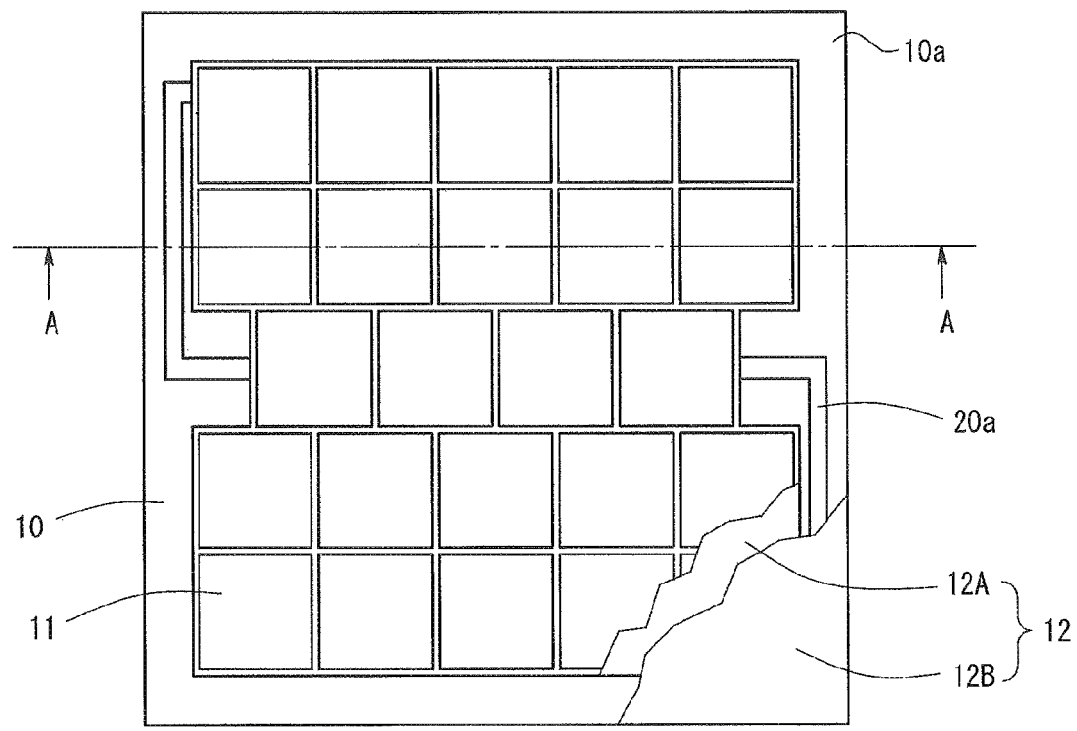
FIG. 3 is a plan view showing the structure viewed from the front surface of the LED package according to Embodiment 1.

FIG. 1 is a sketch showing a cross-sectional view of the structure of the LED package 1 according to Embodiment 1. FIG. 2 is a plan view of the LED package 1 according to Embodiment 1 viewed from the rear surface 10b (the surface opposite to the light extraction surface, i.e., the rear surface 10b of the substrate 10). FIG. 3 is a plan view of the LED package 1 according to Embodiment 1 viewed from the top surface 10a (the light extraction surface, i.e., the top surface 10a of the substrate 10). FIG. 1 is an A-A cross sectional view of FIG. 3.

As shown in FIGS. 1 to 3, the LED package 1 according to Embodiment 1 comprises a substrate 10, a light-emitting device 11 mounted on the substrate 10, a sealing resin 12 sealing the light-emitting device 11, a rear electrode 13 provided on the rear surface 10b of the substrate 10 (the surface opposite to the surface having the light-emitting device 11 of the substrate 10) and electrically connected to the light-emitting device 11, and a heat sink 14 provided on the rear surface 10b of the substrate 10.

The substrate 10 is a ceramic substrate made of AlN. On the surface 10a having the light-emitting device 11 of the substrate 10, a wiring pattern 20 made of Cu is formed. As shown in FIGS. 2 and 3, the substrate 10 is square in a plan view. The substrate 10 may be made of a ceramic material having high thermal conductivity such as $Al_2O_3$ other than AlN.

The light-emitting device 11 is a flip-chip type blue LED made of Group III nitride semiconductor. On the substrate 10, a plurality of light-emitting devices 11 are flip chip mounted as face down, and the wiring pattern 20 formed on the surface 10a of the substrate 10 and the electrode of the light-emitting device 11 are connected to the wiring pattern 20 by using, for example, Ag nanopaste. Each light-emitting device 11 is square in a plan view. A length of one side of the light-emitting device 11 is, for example, 300 μm to 1,700 μm. The number of the light-emitting devices 11 is 24 in total. As shown in FIG. 3, four light-emitting devices 11 are arranged while being shifted by a half of the length of one side of each light-emitting device in the middle row of a 5 by 5 square lattice.

The sealing resin 12 is made of silicone resin, and comprises a phosphor resin 12A mixed with a florescent material and a transparent resin 12B being not mixed with phosphor and transmitting light. The sealing resin 12 may be mixed with a diffusing agent for diffusing light, for example, particles of silicon oxide, aluminum oxide, and titanium oxide.

The phosphor resin 12A is provided so as to cover the light-emitting device 11. The phosphor resin 12A converts a part of blue light emitted from the light-emitting device 11 into a yellow light, and white light is emitted as a whole from the LED package 1 by mixing the yellow light and the blue light. Any phosphor may be mixed in phosphor resin 12A as long as it is excited by the blue light emitted from the light-emitting device 11 to emit yellow light. For example, garnet phosphor such as YAG phosphor, LuAG phosphor, and TAG phosphor, or BOS phosphor, and sialon phosphor may be employed. Color temperature or color rendering may be adjusted by mixing with red phosphor or green phosphor other than yellow phosphor. The thickness of the phosphor resin 12A is designed according to a desired color temperature or color rendering.

The transparent resin 12B is provided so as to cover the phosphor resin 12A. The transparent resin 12B physically and chemically protects the phosphor resin 12A to improve the environment resistance by preventing the phosphor resin 12A from contacting with the outside such as atmospheric air. The light transmitted through the phosphor resin 12A is diffused by the transparent resin 12B, thereby reducing color irregularity. The transparent resin 12B is not necessarily required, but is preferably provided from the above point of view.

The rear electrode 13 is formed on the rear surface 10b of the substrate 10 as shown in FIGS. 1 and 2, and electrically connected through a via (not illustrated) to the wiring pattern 20 on the front surface 10a of the substrate 10. The rear electrode 13 comprises two patterns of anode pattern 13A and cathode pattern 13B, each pattern is formed at diagonal position on the rear surface 10b of the substrate 10. The anode pattern 13A and the cathode pattern 13B are rectangles, and disposed with each side thereof along the sides of the substrate 10. The rear electrode 13 is connected via solder 53 to the wiring pattern 52 on the mounting substrate 50 when the LED package 1 according to Embodiment 1 is mounted on the mounting substrate 50.

The pattern of the rear electrode 13 is not limited to the above, and it may be any pattern. However, to obtain a larger area for the heat sink 14, the rear electrode 13 is preferably formed in a symmetrical pattern at the corners of the substrate 10 as in Embodiment 1. To obtain a larger area for the heat sink 14, the area of the rear electrode 13 is preferably as small as possible within a range where electric connection to the mounting substrate 50 is sufficiently established. The area of the rear electrode 13 is preferably as small as possible to suppress the generation of air bubbles between the solder 53 and the rear electrode 13 when the LED package 1 is mounted via solder 53 to the mounting substrate 50. For example, it is preferably 15% or less the area of the rear surface 10b of the substrate 10, i.e., 7 mm² or less.

The heat sink 14 is formed spaced from the rear electrode 13 on a region except for the rear electrode 13 of the rear surface 10b of the substrate 10 as shown in FIGS. 1 and 2. The heat sink 14 is connected via solder 53 to the Cu pattern 52 of the mounting substrate 50 when the LED package 1 according to Embodiment 1 is mounted to the mounting substrate 50. The heat sink 14 can efficiently radiate heat from the light-emitting device 11 to the mounting substrate side. The heat sink 14 is made of Cu.

The heat sink 14 is divided into eighteen small heat sinks 16 by grooves 15 formed in a rectangular lattice pattern.

Each small heat sink 16 is rectangle. The short sides and long sides of the rectangle are arranged along the sides of the substrate 10. Sixteen small heat sinks 16A of eighteen small heat sinks 16 are equal to each other, and are arranged in a 4 by 4 lattice pattern. The remaining two small heat sinks 16B are arranged in an empty space at the corners surrounded by the rear electrode 13 and the small heat sinks 16A on the rear surface 10b of the substrate 10, and the short sides and long sides thereof is larger than those of the small heat sink 16A. Thus, heat is efficiently radiated by arranging the small heat sinks 16B so as to maximize the area of the heat sink 16B in an empty space.

The grooves 15 are formed for the following reasons. When the LED package 1 according to Embodiment 1 is mounted to the mounting substrate 50, the rear electrode 13 and the heat sink 14 are connected via solder 53 to the mounting substrate 50. At that time, flux of the solder 53 is vaporized into gas, and air bubbles are generated between the heat sink 14 and the solder 53. Conventionally, these air bubbles reduced the contact area between the heat sink 14 and the solder 53, and heat radiation performance was impaired. On the other hand, in the LED package 1 according to Embodiment 1, the grooves 15 are formed in the above pattern on the heat sink 14. Therefore, the gas generated from the solder 53 is efficiently discharged to the outside through the grooves 15, thereby suppressing the generation of air bubbles between the heat sink 14 and the solder 53. As a result, the contact area between the heat sink 14 and the solder 53 is increased, thereby improving heat radiation performance.

When the grooves 15 are formed in a pattern (such as stripe) other than rectangular lattice, a distance where the generated gas passes through the grooves 15 to reach the outside, becomes long. The gas cannot be efficiently discharged to the outside, resulting in insufficient effect of suppressing bubbles. Each of the straight lines constituting the lattice pattern of the grooves 15 is not necessarily in parallel with the sides of the substrate 10, but it is preferably aligned in parallel as in Embodiment 1 in terms of efficient discharge of the gas generated from the solder 53 to the outside and easy manufacturing.

The width of the groove 15 is preferably 10 μm to 300 μm. When the width is less than 10 μm, the gas generated from the solder 53 cannot be efficiently discharged through the grooves 15, and air bubbles frequently remain between the solder 53 and the small heat sink 16, which is not desirable. When the width is larger than 300 μm, the total area of the heat sink 14 is reduced, and heat radiation performance is impaired, which is not desirable. The width of the groove 15 is more preferably, 50 μm to 250 μm, and further preferably, 100 μm to 200 μm.

The area of each small heat sink 16 is as small as possible. The effect of suppressing air bubbles is saturated as the area of each small heat sink 16 is reduced. The area is preferably 0.05 $mm^2$ to 15 $mm^2$ in terms of balance of the effect, heat radiation performance, and easy manufacturing. The area is more preferably, 0.06 $mm^2$ to 10 $mm^2$, and further preferably, 0.08 $mm^2$ to 5 $mm^2$.

The length of the long side of the small heat sink 16 is preferably 7 mm or less. A passage where the gas generated from the solder 53 is discharged through the groove 15 to the outside is shortened so that the gas is efficiently discharged to the outside. Thereby, air bubbles are further suppressed between the solder 53 and the small heat sink 16. The length is more preferably, 5 mm or less, and further preferably, 3.5 mm or less. In terms of heat radiation performance and easy manufacturing, the length of the long side of the small heat sink 16 is preferably 0.3 μm or more.

The number of the small heat sinks 16, that is, the number of division of the heat sink 14 is any number into which the heat sink 14 is divided by the grooves 15 in a rectangular lattice pattern. Any number of division is acceptable as long as the heat sink 14 is divided into four or more small heat sinks 16. When the number of division is increased, the pattern of the grooves 15 is made fine, resulting in the difficulty in manufacturing. Therefore, the number of division is preferably, 64 or less. The area of each small heat sink 16 sectioned by the lattice pattern may not be necessarily equal to each other.

The total area of the heat sink 14 is preferably 60% the area of the rear surface 10b of the substrate 10 to ensure sufficient heat radiation performance. When the area of the heat sink 14 is large, the gas generated from the solder 53 is caught between the solder 53 and the heat sink 14, and air bubbles are easily generated. However, the air bubbles can be sufficiently suppressed by forming the grooves 15. The total area of the heat sink 14 is more preferably, 70% or more, and further preferably, 85% or more the area of the rear surface 10b of the substrate 10.

To sufficiently ensure the installation area of the rear electrode 13, the total area of the heat sink 14 is preferably 95% or less the area of the rear surface 10b of the substrate 10. In a plan view, the entire array pattern of the light-emitting device 11 is preferably included in a region where the heat sink 14 is formed to efficiently radiate heat generated from the light-emitting device 11 via the heat sink 14.

The area of the rear surface 10b of the substrate 10 is not limited, but the LED package 1 according to Embodiment 1 is effective particularly when the area of the rear surface 10b of the substrate 10 is 4 $mm^2$ or more. When the area of the rear surface 10b of the substrate 10 is large, a larger area can be obtained for the heat sink 14 for radiating heat.

To improve heat radiation performance, the thickness of the heat sink 14 is preferably as large as possible, and preferably 5 μm or more. The thickness is more preferably, 10 μm or more, and further preferably, 20 μm or more. In terms of easy manufacturing or easy mounting of the LED package 1 to the mounting substrate 50, the thickness of the heat sink 14 is preferably, 300 μm or less.

The heat sink 14 may be made of a material having high thermal conductivity other than Cu. For example, Al or alloy containing Cu or Al as a main component may be used.

The pattern of the grooves 15 can be set regardless of the array pattern of the light-emitting device 11. It is because the pattern of the grooves 15 formed on the heat sink 14 does not have direct effect on heat radiation performance of the heat sink 14.

From the above, in the LED package 1 according to Embodiment 1, the heat sink 14 on the rear surface 10b of the substrate 10 is divided into small rectangular heat sinks 16 by the grooves 15 formed in a lattice pattern. When the LED package 1 according to Embodiment 1 is mounted via solder 53 to the mounting substrate 50, the gas generated from the solder 53 is efficiently discharged through the grooves 15 to the outside. Therefore, the generation of air bubbles is suppressed between the solder 53 and the heat sink 14, and the contact area between the solder 53 and the heat sink 14 is increased, thereby improving heat radiation performance.

Embodiment 2

Figure 4:
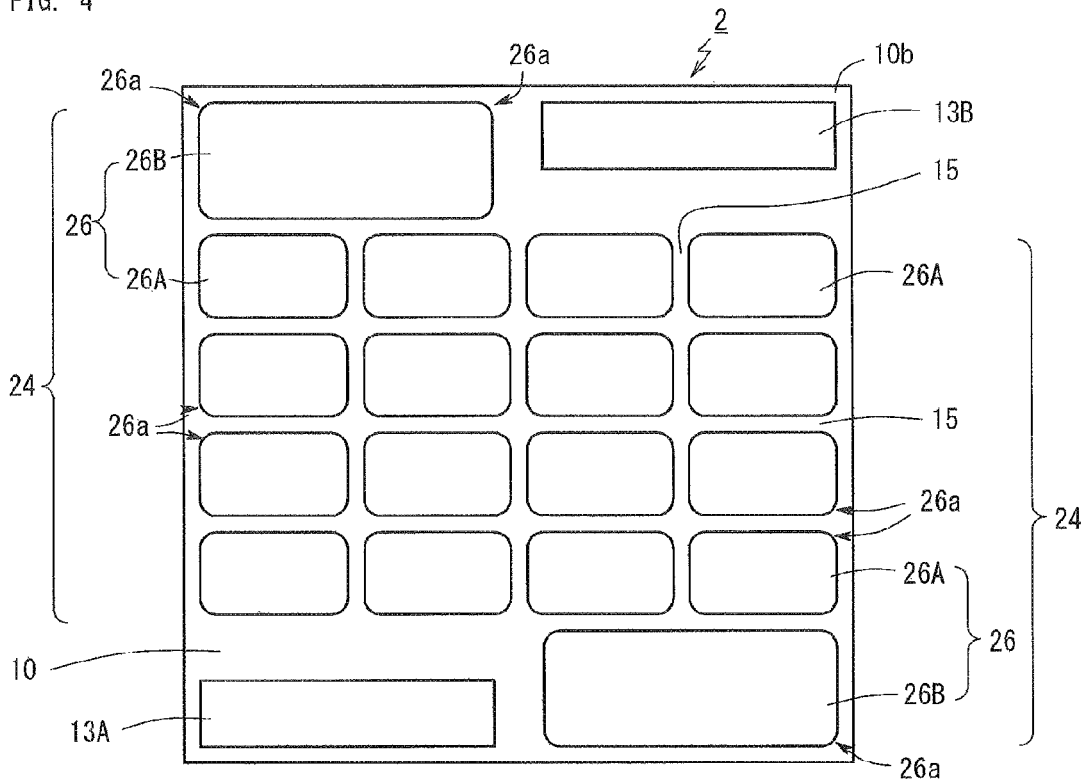
FIG. 4 is a plan view showing the structure viewed from the rear surface of a LED package according to Embodiment 2.

FIG. 4 is a plan view showing the structure viewed from the rear surface 10b of the LED package 2 according to Embodiment 2. The LED package 2 according to Embodiment 2 has the same structure of the LED package 1 according to Embodiment 1 except for that the heat sink 14 of the LED package 1 according to Embodiment 1 was replaced with the heat sink 24 described below.

In the heat sink 24, the small heat sinks 16 of the heat sink 14 of the embodiment 1 are replaced with the small heat sinks 26 having rounded corners 26a. The curvature radius of each corner 26a is 8 μm. Other structures are the same as those of the heat sink 14. Such rounding of corners 26a releases the stress applied to the connecting portion between the solder 53 and the heat sink 24, more specifically the stress applied to the connecting portion between the corners 26a of the small heat sinks 26 and the solder 53, thereby improving the temperature cycle resistance.

In Embodiment 2, the curvature radius of each corner 26a is 8 μm, but it is not limited to this. However, the curvature radius of each corner 26a is preferably 0.01 to 0.5 times the length of the short side of the small heat sink 26. Within this range, the stress can be sufficiently released. The curvature radius of each corner 26a is more preferably, 0.02 to 0.4 times, and further preferably, 0.15 to 0.2 times the length of the short side of the respective small heat sinks 26A and 26B. For the same reason, the curvature radius of each corner 26a is preferably 10 μm to 300 μm. The curvature radius of each corner 26a is more preferably, 50 μm to 250 μm, and further preferably, 100 μm to 150 μm. Moreover, roundness of each corner 26a may not necessarily be a circle, and may be an ellipse.

Embodiment 3

Figure 5:
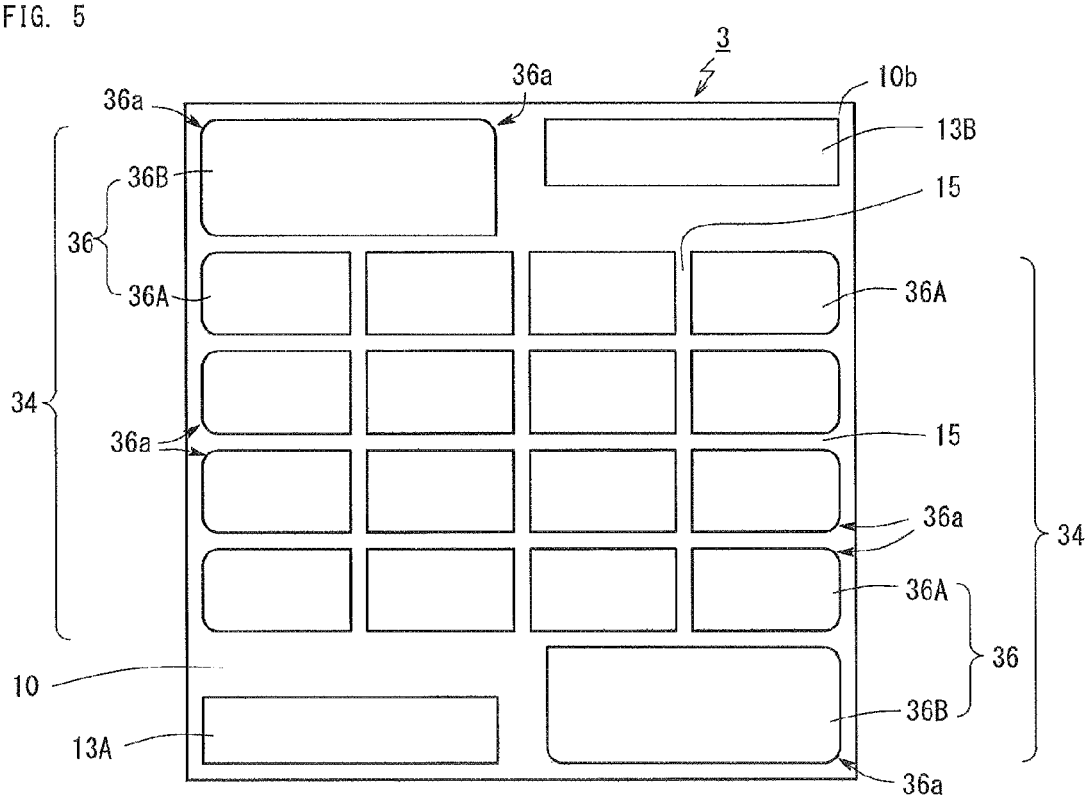
FIG. 5 is a plan view showing the structure viewed from the rear surface of a LED package according to Embodiment 3.

FIG. 5 is a plan view showing the structure viewed from the rear surface 10b of a LED package 3 according to Embodiment 3. The LED package 3 according to Embodiment 3 has the same structure of the LED package 1 according to Embodiment 1 except for that the heat sink 14 of the LED package 1 according to Embodiment 1 was replaced with the heat sink 34 described below.

In the heat sink 34, the small heat sinks 16 of the heat sink 14 of the embodiment 1 are replaced with the small heat sinks 36. In the small heat sink 36, of the corners of the small heat sinks 36, only the corners 36a adjacent to the sides of the substrate 10 are rounded, and other corners are not rounded. In the small heat sink 36, rounding the corners not adjacent to the sides of the substrate 10 does not only contribute to the release of the stress, but also a stronger stress is applied. Therefore, stress can be more efficiently released by rounding only the corners 36a adjacent to the sides of the substrate 10. The curvature radius of each corner 36a is preferably within the same range as that of each corner 26a in Embodiment 2.

EXPERIMENTS

The results of the experiments regarding the LED packages 1 and 2 according to Embodiments 1 and 2 will next be described.

Experiment 1

The experiment 1 was performed to check whether air bubbles are reduced between the solder 53 and the heat sink 14 when the LED package 1 according to Embodiment 1 is mounted. An Al substrate as the mounting substrate 50 on which a Cu pattern 52 via an insulating layer 51 was formed was used. The Cu pattern 52 on the mounting substrate 50 was connected by SnAgCu solder 53 to the rear electrode 13 and the heat sink 14. As a result, when a LED package (comparative example) in which the heat sink 14 is not divided into small heat sinks without forming grooves, was mounted, air bubbles having an area of 35% the total area of the heat sink 14 were generated. When the LED package 1 according to Embodiment 1 was mounted, air bubbles having an area of 12% the total area of the heat sink 14 were generated. It was confirmed that air bubbles were reduced by forming the grooves 15 on the heat sink 14, and the contact area between the heat sink 14 and the solder 53 was increased.

Experiment 2

Figure 6A:
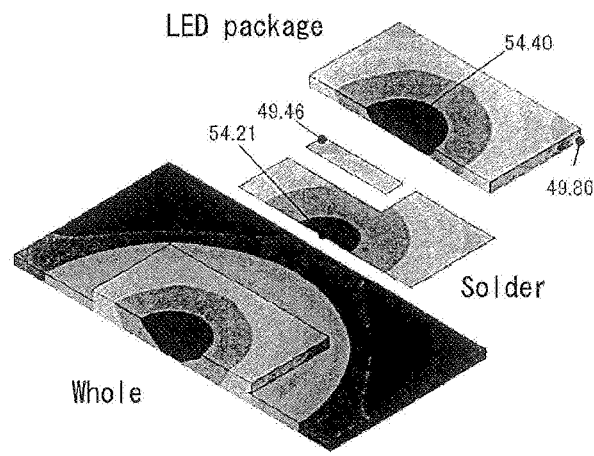
FIGS. 6A to 6C are images showing the temperature distribution when light is emitted from a LED package mounted to a mounting substrate.
Figure 6B:
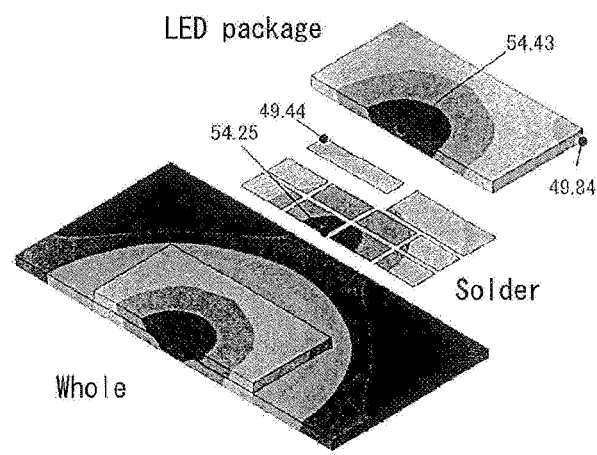
Figure 6C:
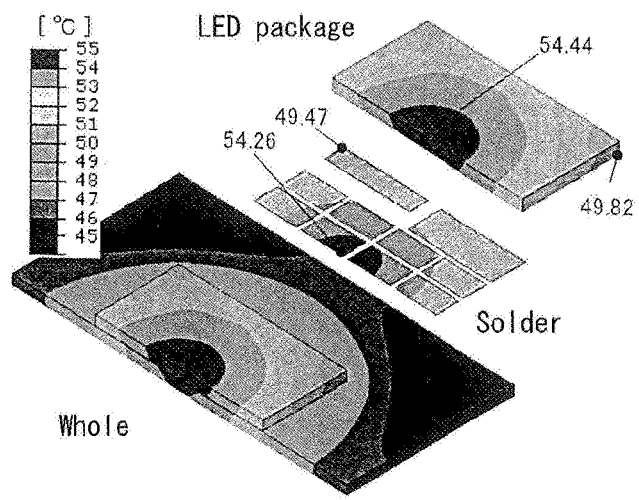

FIGS. 6A to 6C are thermal images showing the temperature distributions of three portions: LED package, solder, combined whole of LED package and mounting substrate, which were calculated by simulation when the LED packages according to comparative example and embodiments 1 and 2 are mounted to the mounting substrate to emit light. FIG. 6A is the case of comparative example, FIG. 6B is the case of Example 1, and FIG. 6C is the case of Example 2. A case was assumed where an Al substrate 50 as a mounting substrate on which a Cu pattern 52 via an insulating layer 51 is formed is used, and the Cu pattern 52 on the mounting substrate 50 is connected by SnAgCu solder 53 to the rear electrode 13 and the heat sink 14. Simulation was performed assuming no air bubbles between solder 53 and the heat sinks 14 and 24.

From a comparison among FIGS. 6A, 6B, and 6C, it was found that even if the heat sinks 14 and 24 are divided into small heat sinks by forming the grooves 15, there is little effect on thermal conductivity. Therefore, the heat radiation performance of the heat sinks 14 and 24 hardly depends on the pattern of the grooves 15, and largely depends on the contact area between the solder 53 and the heat sinks 14 and 24. In the LED packages 1 and 2 according to embodiments 1 and 2, air bubbles are more difficult to generate between the solder 53 and the heat sinks 14 and 24 than in the LED package according to comparative example so that the contact area between the solder 53 and the heat sinks 14 and 24 is increased. As a result, the LED packages 1 and 2 according to embodiments 1 and 2 have higher heat radiation performance than that of the LED package according to comparative example. From the result that difference in the pattern of the grooves 15 hardly affects the heat radiation performance of the heat sinks 14 and 24, it is found that the pattern of the grooves 15 can be designed independently from the array pattern of the light-emitting device 11.

From a comparison between FIGS. 6B and 6C, it was found that there is little effect on thermal conductivity even if the small heat sinks 26 are where the corners of the small heat sinks 16 are rounded.

Experiment 3

Figure 7A:
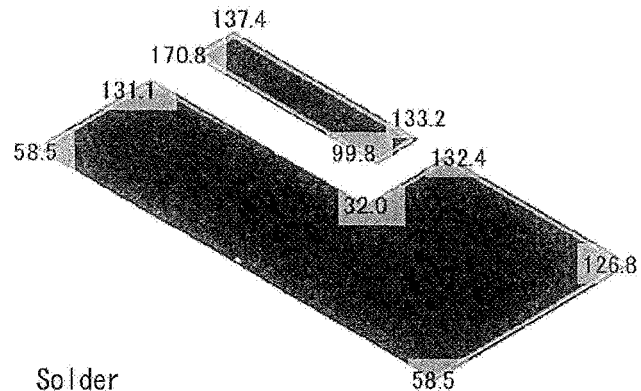
FIGS. 7A to 7C are images showing the stress distribution applied to solder when a LED package is mounted to a mounting substrate.
Figure 7B:
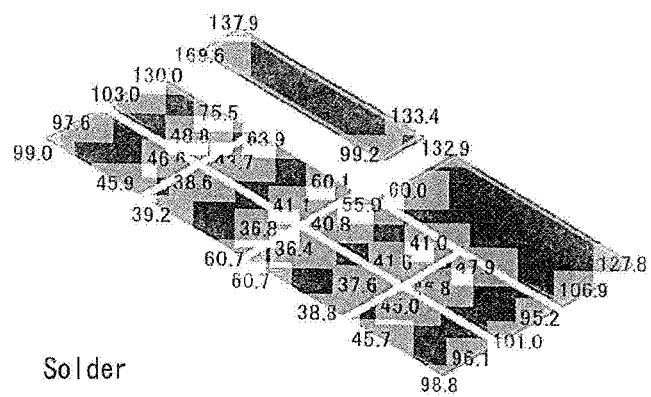
Figure 7C:
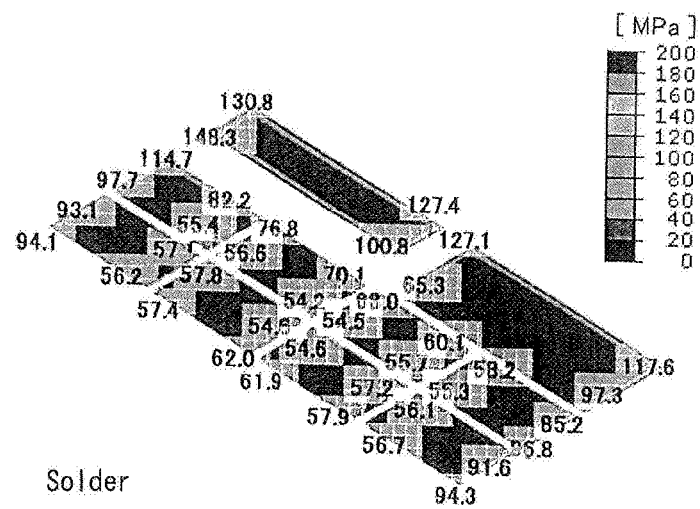

FIGS. 7A to 7C show the distribution of the von Mises stresses applied to solder calculated by simulation in the case where the LED packages according to comparative example, embodiments 1 and 2 are mounted on the mounting substrate. FIG. 7A is the case of comparative example, FIG. 7B is the case of embodiment 1, and FIG. 7C is the case of embodiment 2. Simulation conditions are the same as those of experiment 2. The values of the von Mises stresses applied to the corners of the heat sinks are shown in FIGS. 7A to 7C.

As is clear from comparison between FIG. 7A and FIG. 7B, a higher stress is applied to the solder 53 bonded to the corners of the small heat sinks 16 because the heat sink 14 is divided into small heat sinks 16 by the grooves 15. From comparison between FIG. 7B in which the small heat sinks 16 have no round corners and FIG. 7C in which the small heat sinks 26 have round corners, it is also found that stress applied to the solder 53 bonded to the corners adjacent to the sides of the substrate 10 of the corners of the small heat sinks 26, is reduced compared with the small heat sinks 16. It is found that at the corners not adjacent to the sides of the substrate 10 of the corners of the small heat sinks 26, stress applied to the solder 53 bonded to those corners hardly changes or stronger stress is applied compared with the small heat sinks 16. Therefore, it is found that stress can be efficiently released by rounding only the corners adjacent to the sides of the substrate 10 as in the small heat sinks 36 according to Embodiment 3.

Variation

In the LED packages according to embodiments 1 to 3, a blue light-emitting LED made of Group III nitride semiconductor was used as the light-emitting device 11. The present invention is not limited to this, a light-emitting device emitting any color, being made of any material and having any structure may be used. Various color phosphors may be used as phosphor being mixed in phosphor resin 12A so that the entire LED package emits a desirable color.

In the LED packages according to embodiments 1 to 3, the corners of the rear electrode 13 may be rounded. As in the heat sinks 24 and 34 according to embodiments 2 and 3, stress applied to the corners can be released, thereby improving the temperature cycle resistance. In this case, as in embodiment 3, only the corners adjacent to the sides of the substrate 10 are preferably rounded.

The LED package of the present invention can be employed as a light source for illumination or backlight.

What is claimed is:

1. An LED package comprising:
   a substrate having a rectangular shape;
   light-emitting device mounted on the substrate;
   sealing resin sealing the light-emitting device and mixed with phosphor;
   a heat sink provided on a rear surface of the substrate; and
   a rear electrode provided on the rear surface of the substrate and electrically connected to the light-emitting device;
   wherein the heat sink is divided into a plurality of small heat sinks, each having rectangular shape by grooves formed in a lattice pattern in a central part of the rear surface of the substrate, each of four sides of each small heat sink is in parallel with a corresponding side of the substrate,
   wherein the rear electrode comprises an anode pattern and a cathode pattern, each pattern is formed at a diagonal position on the rear surface of the substrate, the anode pattern and the cathode pattern have rectangular shapes, and each of four sides of the anode pattern and the cathode pattern is in parallel with a corresponding side of the substrate, and
   wherein the heat sink also comprises two corner heat sinks, each of the corner heat sinks is arranged in an empty space at diagonal corners of the rear surface adjacent to the anode pattern and the cathode pattern, respectively, and a short side and a long side of the corner heat sinks are longer than a short side and a long side of the small heat sinks of the central part, respectively.

2. The LED package according to claim 1, wherein a width of the groove dividing the heat sink is 10 μm to 300 μm.

3. The LED package according to claim 1, wherein an area of each small heat sink is 0.05 mm$^2$ to 15 mm$^2$.

4. The LED package according to claim 1, wherein a length of a long side of each small heat sink is 7 mm or less.

5. The LED package according to claim 1, wherein a total area of the heat sink is 50 mm$^2$ or more.

6. An LED package, comprising:
   a substrate having a rectangular shape;
   a light-emitting device mounted on the substrate;
   sealing resin sealing the light-emitting device and mixed with phosphor;
   a heat sink provided on a rear surface of the substrate; and
   a rear electrode provided on the rear surface of the substrate and electrically connected to the light-emitting device;
   wherein the heat sink is divided into a plurality of small heat sinks each having rectangular shape by grooves formed in a lattice pattern, and
   wherein four corners of each small heat sink are rounded and the grooves have a straight region and a crossing region of the lattice pattern, the straight region having a constant width and a width of the crossing region being larger than the constant width of the straight region.

7. The LED package according to claim 6, wherein a curvature radius of the rounded corner of the small heat sink is 0.01 to 0.5 times a length of a short side of a rectangle of the small heat sink.

8. The LED package according to claim 6, wherein a curvature radius of the rounded corner of the small heat sink is 10 μm to 300 μm.

9. The LED package according to claim 7, wherein a curvature radius of the rounded corner of the small heat sink is 10 μm to 300 μm.

10. The LED package according to claim 6, wherein a width of the groove dividing the heat sink is 10 μm to 300 μm.

11. The LED package according to claim 6, wherein an area of each small heat sink is 0.05 mm$^2$ to 15 mm$^2$.

12. The LED package according to claim 6, wherein a length of a long side of each small heat sink is 7 mm or less.

13. The LED package according to claim 6, wherein a total area of the heat sink is 50 mm$^2$ or more.

14. An LED package comprising:
   a substrate having a rectangular shape;
   a light-emitting device mounted on the substrate;
   sealing resin sealing the light-emitting device and mixed with phosphor;
   a heat sink provided on a rear surface of the substrate; and
   a rear electrode provided on the rear surface of the substrate and electrically connected to the light-emitting device;
   wherein the heat sink is divided into a plurality of small heat sinks, each having rectangular shape by grooves formed in a lattice pattern, and
   wherein only corners adjacent to four sides of the substrate of four corners of each small heat sink are rounded.

15. The LED package according to claim 14, wherein a curvature radius of the rounded corner of the small heat sink is 0.01 to 0.5 times a length of a short side of a rectangle of the small heat sink.

16. The LED package according to claim 14, wherein a curvature radius of the rounded corner of the small heat sink is 10 μm to 300 μm.

17. The LED package according to claim 14, wherein a width of the groove dividing the heat sink is 10 μm to 300 μm.

18. The LED package according to claim 14, wherein an area of each small heat sink is 0.05 mm$^2$ to 15 mm$^2$.

19. The LED package according to claim 14, wherein a length of a long side of each small heat sink is 7 mm or less.

20. The LED package according to claim 14, wherein a total area of the heat sink is 50 mm$^2$ or more.

* * * * *